United States Patent
Cui et al.

(10) Patent No.: US 12,316,028 B2
(45) Date of Patent: May 27, 2025

(54) MULTI-BAND PHASED ARRAY AND ELECTRONIC DEVICE

(71) Applicant: HUAWEI TECHNOLOGIES CO., LTD., Guangdong (CN)

(72) Inventors: Keji Cui, Shenzhen (CN); Tianyu Shen, Shenzhen (CN); Yongchang Yu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 244 days.

(21) Appl. No.: 18/193,366

(22) Filed: Mar. 30, 2023

(65) Prior Publication Data
US 2023/0238701 A1 Jul. 27, 2023

Related U.S. Application Data (63) Continuation of application No. PCT/CN2020/119182, filed on Sep. 30, 2020.

(51) Int. Cl.
| | |
|---|---|
| *H01Q 5/50* | (2015.01) |
| *H01P 5/19* | (2006.01) |
| *H03F 1/26* | (2006.01) |
| *H03F 1/56* | (2006.01) |
| *H03F 3/24* | (2006.01) |

(52) U.S. Cl.
CPC ............... *H01Q 5/50* (2015.01); *H01P 5/19* (2013.01); *H03F 1/26* (2013.01); *H03F 1/565* (2013.01); *H03F 3/245* (2013.01); *H03F 2200/222* (2013.01); *H03F 2200/366* (2013.01); *H03F 2200/387* (2013.01); *H03F 2200/451* (2013.01)

(58) Field of Classification Search
CPC ............ H01Q 1/241; H01Q 3/36; H01Q 5/30; H01Q 5/50; H01Q 21/06; H01P 5/19; H03F 1/26
See application file for complete search history.

(56) References Cited

U.S. PATENT DOCUMENTS

| | | | |
|---|---|---|---|
| 2018/0115087 A1* | 4/2018 | Besoli ..................... H01Q 3/26 |
| 2018/0166795 A1* | 6/2018 | Pruett ..................... H01Q 3/22 |
| 2019/0319649 A1 | 10/2019 | Malik et al. | |

FOREIGN PATENT DOCUMENTS

| | | | | |
|---|---|---|---|---|
| CN | 101714852 A | 5/2010 | | |
| CN | 104937836 A | 9/2015 | | |
| WO | WO-2012093392 A1 * | 7/2012 | ............. H01P 5/185 |
| WO | WO-2016192009 A1 * | 12/2016 | ............... H01P 1/18 |

* cited by examiner

*Primary Examiner* — Hoang V Nguyen
(74) *Attorney, Agent, or Firm* — Fish & Richardson P.C.

(57) ABSTRACT

Example multi-band phased array are described. One example multi-band phased array includes a plurality of branches coupled to a plurality of multi-band antennas. Each of the plurality of branches includes a low noise amplifier and a power amplifier. The power amplifier and the low noise amplifier are configured to transmit and receive, in a time-sharing manner, a signal of a first frequency band and a signal of a second frequency band that are received by the multi-band phased array, and the first frequency band and the second frequency band are different and do not overlap. Each of the plurality of branches further includes a phase shifter, where the phase shifter is configured to perform phase shifting on the signal of the first frequency band, and the phase shifter is further configured to perform phase shifting on the signal of the second frequency band.

20 Claims, 8 Drawing Sheets

MULTI-BAND PHASED ARRAY AND ELECTRONIC DEVICE

CROSS-REFERENCE TO RELATED APPLICATIONS

This application is a continuation of International Application No. PCT/CN2020/119182, filed on Sep. 30, 2020, the disclosure of which is hereby incorporated by reference in its entirety.

TECHNICAL FIELD

This application relates to the field of wireless communication, and in particular, to a multi-band phased array.

BACKGROUND

Due to limited frequency resources in a low frequency band in wireless communication, a trend of high-frequency development becomes inevitable. For example, a millimeter-wave frequency band is widely studied due to abundant spectrum resources in the millimeter-wave frequency band. As a frequency increases, a high path loss limits development of the frequency. A phased array technology provides a possible solution. In a high-frequency communication field, a vehicle-mounted radar field, and a related technical field of 5G new radio (NR), the phased array technology becomes a mandatory technical means.

To make full use of frequency resources, a phased array supporting a plurality of frequency bands gradually becomes an important technical trend. A conventional phased array supporting a plurality of frequency bands is generally designed as a wideband coverage phased array with single-ended input and output, which brings great challenges to power consumption and a signal-to-noise ratio of the phased array.

SUMMARY

Embodiments of this application provide a multi-band phased array, which optimizes power consumption and a signal-to-noise ratio compared with a conventional multi-band phased array.

To achieve the foregoing objectives, the following technical solutions are used in the embodiments of this application.

According to a first aspect, a multi-band phased array is provided, including a plurality of branches coupled to a plurality of multi-band antennas. Each of the plurality of branches includes a low noise amplifier, where the low noise amplifier is configured to amplify a signal of a first frequency band and a signal of a second frequency band that are received by the multi-band phased array, and the first frequency band and the second frequency band are different and do not overlap. The first low noise amplifier includes an input matching network, a signal amplification circuit, a first output matching network, and a second output matching network, where the input matching network is coupled to an input terminal of the signal amplification circuit and is configured to match the signal of the first frequency band and the signal of the second frequency band. The first output matching network is coupled to a first output terminal of the signal amplification circuit, and the second output matching network is coupled to a second output terminal of the signal amplification circuit. The first low noise amplifier further includes a control circuit, where the control circuit is configured to select the first output terminal to output the signal that is of the first frequency band and that is output by the signal amplification circuit, and the control circuit is further configured to select the second output terminal to output the signal that is of the second frequency band and that is output by the signal amplification circuit. Each of the plurality of branches further includes a phase shifter, where the phase shifter is configured to perform phase shifting on the signal that is of the first frequency band and that is output by the first output terminal, and the phase shifter is further configured to perform phase shifting on the signal that is of the second frequency band and that is output by the second output terminal.

Based on the foregoing architecture of the multi-band phased array, in a receive amplification design of this architecture, signals of different frequency bands may be flexibly received purposefully, to achieve a better signal-to-noise ratio and better power consumption.

In a possible implementation, a difference between a center frequency of the first frequency band and a center frequency of the second frequency band is greater than 30%. Based on the application scenario of the signals of the foregoing frequency bands, signals of different frequency bands whose center frequencies differ greatly may be separately output by using the first output terminal or the second output terminal. The foregoing architecture of the multi-band phased array has advantages in signal-to-noise ratio and power consumption.

In a possible implementation, the multi-band phased array is configured to receive the signal of the first frequency band and the signal of the second frequency band in a time-sharing manner. Based on the application scenario of the signals of the foregoing frequency bands, one of the two output terminals may be selected to achieve a higher system receive gain.

In a possible implementation, the multi-band phased array is further configured to receive a signal of a third frequency band, and the third frequency band and the first frequency band are different but overlap. A same amplifier may be reused for signals of different frequency bands whose center frequencies are close, to reduce costs and further improve bandwidth of a signal received by the multi-band phased array.

In a possible implementation, the control circuit is configured to select the first output terminal to output the signal that is of the third frequency band and that is amplified by the amplification circuit. A same output terminal and a same amplification sub-circuit of the low noise amplifier may be reused for signals of the first frequency band and the third frequency band whose center frequencies are close, so that a circuit module is reused, and use efficiency is improved.

In a possible implementation, the multi-band phased array is configured to simultaneously receive the signal of the first frequency band and the signal of the third frequency band. Because center frequencies of the signals of the first frequency band and the third frequency band are close, simultaneous receiving may have better bandwidth and gain, and does not additionally increase load of the signal amplification circuit.

In a possible implementation, the signal amplification circuit includes a first negative channel metal oxide semiconductor (NMOS) transistor, a second NMOS transistor, and a third NMOS transistor, where a gate terminal of the first NMOS transistor is coupled to the input matching network, a source terminal of the first NMOS transistor is grounded in a coupling manner, and a source terminal of the second NMOS transistor and a source terminal of the third NMOS transistor are jointly coupled to a drain terminal of the first NMOS transistor. The control circuit is configured to output a first enable signal and a second enable signal, the first enable signal is used to select the signal of the first frequency band by controlling a gate terminal of the second NMOS transistor, and the second enable signal is used to select the signal of the second frequency band by controlling a gate terminal of the third NMOS transistor. A drain terminal of the second NMOS transistor is coupled to the first output matching network, and a drain terminal of the third NMOS transistor is coupled to the second output matching network. The foregoing architecture of superimposed NMOS transistors is used, so that signals of different frequency bands can be flexibly amplified, and a good isolation effect can be achieved for signals of different frequency bands.

In a possible implementation, the phase shifter includes a first phase shift branch and a second phase shift branch. The first phase shift branch is coupled to the first output terminal and is configured to perform phase shifting on the signal that is of the first frequency band and that is output by the first output terminal. The second phase shift branch is coupled to the second output terminal and is configured to perform phase shifting on the signal that is of the second frequency band and that is output by the second output terminal. The foregoing two branches are used to separately perform phase shifting, so that the phase shifter may separately perform phase shifting on signals of different frequency bands, thereby reducing design difficulty of the phase shifter, and increasing flexibility of designing a phase shift function of the multi-band phased array.

In a possible implementation, the first phase shift branch includes a first frequency mixer and a first phase shift unit, and the second phase shift branch includes a second frequency mixer and a second phase shift unit. The first phase shift unit is coupled between the first frequency mixer and a local oscillator signal generator, and the second phase shift unit is coupled between the second frequency mixer and the local oscillator signal generator. A phase shift manner of a local oscillator signal is used, so that the multi-band phased array has more advantages in phase shift processing of a broadband signal.

In a possible implementation, the local oscillator signal generator includes a first local oscillator signal generator and a second local oscillator signal generator. The first phase shift unit is coupled between the first local oscillator signal generator and the first frequency mixer, and the second phase shift unit is coupled between the second local oscillator signal generator and the second frequency mixer. The foregoing manner in which different local oscillator signal generators are used to separately provide local oscillator signals is used, so that design difficulty of the local oscillator signal generator of the multi-band phased array is reduced, and flexibility is improved.

In a possible implementation, the first phase shift branch further includes a third phase shifter, where the third phase shifter is coupled between the first frequency mixer and an intermediate frequency signal processor and is configured to perform phase shifting on an intermediate frequency signal of the first phase shift branch. The second phase shift branch further includes a fourth phase shifter, where the fourth phase shifter is coupled between the second frequency mixer and the intermediate frequency signal processor and is configured to perform phase shifting on an intermediate frequency signal of the second phase shift branch. The foregoing manner in which phase shifting of an intermediate frequency signal and phase shifting of a local oscillator signal are combined is used, so that a combination design of the multi-band phased array is greatly optimized.

In a possible implementation, each of the plurality of branches further includes a power amplifier. The power amplifier includes a first input matching network, a second input matching network, a power amplification circuit, and an output matching network. The first input matching network is coupled to a first input terminal of the power amplification circuit, the second input matching network is coupled to a second input terminal of the power amplification circuit, and the output matching network is coupled to an output terminal of the power amplification circuit. The power amplifier further includes a control circuit, where the control circuit is configured to select the first input terminal to input a signal that is of the first frequency band and that is to be amplified by the power amplification circuit, and the control circuit is further configured to select the second input terminal to input a signal that is of the second frequency band and that is to be amplified by the power amplification circuit. A multi-band power amplifier is integrated, so that the multi-band phased array may further implement multi-band transceiver and phase shift functions based on the foregoing implementation.

In a possible implementation, the power amplification circuit includes a third NMOS transistor, a fourth NMOS transistor, and a fifth NMOS transistor, where a drain terminal of the third NMOS transistor is coupled to a power supply terminal by using the output matching network, a gate terminal of the third NMOS transistor is configured to receive a bias voltage, and a drain terminal of the fourth NMOS transistor and a drain terminal of the fifth NMOS transistor are jointly coupled to a source terminal of the third NMOS transistor. The control circuit is configured to output a first enable signal and a second enable signal, the first enable signal is used to select the to-be-amplified signal of the first frequency band by controlling a gate terminal of the fourth NMOS transistor, and the second enable signal is used to select the to-be-amplified signal of the second frequency band by controlling a gate terminal of the fifth NMOS transistor. The gate terminal of the fourth NMOS transistor is coupled to the first input matching network, and a source terminal of the fourth NMOS transistor is grounded in a coupling manner. The gate terminal of the fifth NMOS transistor is coupled to the second input matching network, and a source terminal of the fifth NMOS transistor is grounded in a coupling manner.

In a possible implementation, a first input terminal of the power amplifier is coupled to a first output terminal of the low noise amplifier, and a second input terminal of the power amplifier is coupled to a second output terminal of the low noise amplifier.

According to a second aspect, a multi-band phased array is provided, including a plurality of branches coupled to a plurality of multi-band antennas. Each of the plurality of branches includes a power amplifier, where the power amplifier is configured to amplify a signal of a first frequency band and a signal of a second frequency band that are transmitted by the multi-band phased array, and the first frequency band and the second frequency band are different and do not overlap. The power amplifier includes a first input matching network, a second input matching network, a power amplification circuit, and an output matching network. The first input matching network is coupled to a first input terminal of the power amplification circuit, the second input matching network is coupled to a second input terminal of the power amplification circuit, and the output matching network is coupled to an output terminal of the power amplification circuit. The power amplifier further includes a control circuit, where the control circuit is configured to select the first input terminal to input a signal that is of the first frequency band and that is to be amplified by the power amplification circuit, and the control circuit is further configured to select the second input terminal to input a signal that is of the second frequency band and that is to be amplified by the power amplification circuit. Each of the plurality of branches further includes a phase shifter, where the phase shifter is configured to perform phase shifting on the signal that is of the first frequency band and that is input by the first input terminal, and the phase shifter is further configured to perform phase shifting on the signal that is of the second frequency band and that is input by the second input terminal.

In a possible implementation, a difference between a center frequency of the first frequency band and a center frequency of the second frequency band is greater than 30%. Based on the application scenario of the signals of the foregoing frequency bands, signals of different frequency bands whose center frequencies differ greatly may be separately input by using the first input terminal or the second input terminal. The foregoing architecture of the multi-band phased array has advantages in transmit efficiency and power consumption.

In a possible implementation, the multi-band phased array is configured to transmit the signal of the first frequency band and the signal of the second frequency band in a time-sharing manner. Based on the application scenario of the signals of the foregoing frequency bands, one of the two input terminals may be selected to achieve a higher system transmit gain.

In a possible implementation, the multi-band phased array is further configured to transmit a signal of a third frequency band, and the third frequency band and the first frequency band are different but overlap. A same amplification branch of the PA may be reused for signals of different frequency bands whose center frequencies are close, to reduce costs and further improve bandwidth of a signal transmitted by the multi-band phased array.

In a possible implementation, the control circuit is configured to select the first input terminal to input a signal that is of the third frequency band and that is to be amplified by the power amplification circuit. A same input terminal and a same amplification sub-circuit of the power amplifier may be reused for signals of the first frequency band and the third frequency band whose center frequencies are close, so that a circuit module is reused, and use efficiency is improved.

In a possible implementation, the multi-band phased array is configured to simultaneously transmit the signal of the first frequency band and the signal of the third frequency band. Because center frequencies of the signals of the first frequency band and the third frequency band are close, simultaneous transmitting may have better bandwidth and gain, and does not additionally increase load of the power amplification circuit.

It should be understood that the multi-band phased array in the second aspect may further have another possible implementation. For details, refer to features of the multi-band phased array in various possible implementations of the first aspect. Details are not described herein.

According to a third aspect, a multi-band phased array is provided, including a plurality of branches coupled to a plurality of multi-band antennas. Each of the plurality of branches includes a low noise amplifier and a power amplifier. The power amplifier and the low noise amplifier are configured to transmit and receive, in a time-sharing manner, a signal of a first frequency band and a signal of a second frequency band that are received by the multi-band phased array, and the first frequency band and the second frequency band are different and do not overlap. Each of the plurality of branches further includes a phase shifter, where the phase shifter is configured to perform phase shifting on the signal of the first frequency band, and the phase shifter is further configured to perform phase shifting on the signal of the second frequency band. The phase shifter includes a first phase shift branch and a second phase shift branch. The first phase shift branch is configured to perform phase shifting on the signal of the first frequency band, and the second phase shift branch performs phase shifting on the signal of the second frequency band.

It should be understood that the multi-band phased array in the third aspect may further have another possible implementation. For details, refer to features of the multi-band phased array in various possible implementations of the first aspect and the second aspect. Details are not described herein.

According to a fourth aspect, an electronic device is provided, including a transceiver, a memory, and a processor, where the foregoing multi-band phased array is disposed in the transceiver.

DESCRIPTION OF EMBODIMENTS

The following describes in detail technical solutions in embodiments of the present invention with reference to accompanying drawings. It is clear that the described embodiments are merely some rather than all of embodiments of the present invention. All other embodiments obtained by a person of ordinary skill in the art based on embodiments of the present invention without creative efforts shall fall within the protection scope of the present invention.

In a wireless communication system, devices may be classified into devices that provide a wireless network service and devices that use the wireless network service. The devices that provide the wireless network service are devices that form a wireless communication network, and may be briefly referred to as network devices (network equipment) or network elements. The network devices usually belong to operators (for example, China Mobile and Vodafone) or infrastructure providers (for example, China Tower), and are operated or maintained by these vendors. The network devices may be further classified into a radio access network (RAN) device and a core network (CN) device. The RAN device typically includes a base station (BS).

It should be understood that the base station may also sometimes be referred to as a wireless access point (AP) or a transmission reception point (TRP). Specifically, the base station may be a universal NodeB (gNB) in a 5G new radio (NR) system or an evolved NodeB (eNB) in a 4G long term evolution (LTE) system. Base stations may be classified into a macro base station or a micro base station based on different physical forms or transmit power of the base stations. The micro base station is also sometimes referred to as a small-cell base station or a small cell.

The devices that use the wireless network service are usually located on an edge of a network, and may be briefly referred to as terminals. The terminal can establish a connection to the network device, and provide a specific wireless communication service for a user based on a service of the network device. It should be understood that, because the terminal has a closer relationship with the user, the terminal is also sometimes referred to as user equipment (UE) or a subscriber unit (SU). In addition, compared with a base station that is usually placed at a fixed location, the terminal usually moves along with the user, and is also sometimes referred to as a mobile station (MS). In addition, some network devices such as a relay node (RN) or a wireless router may also sometimes be considered as terminals because the network devices have a UE identity or belong to the user.

Specifically, the terminal may be a mobile phone, a tablet computer, a laptop computer, a wearable device (for example, a smartwatch, a smart band, a smart helmet, or smart glasses), other devices that have a wireless access capability, for example, an intelligent vehicle and various Internet of Things (IOT) devices including various smart home devices (such as a smart meter and a smart appliance) and smart city devices (such as a security protection or monitoring device and an intelligent road transportation facility), and the like.

For ease of description, the technical solutions in the embodiments of this application are described in detail by using a base station and a terminal as examples in this application.

Figure 1:
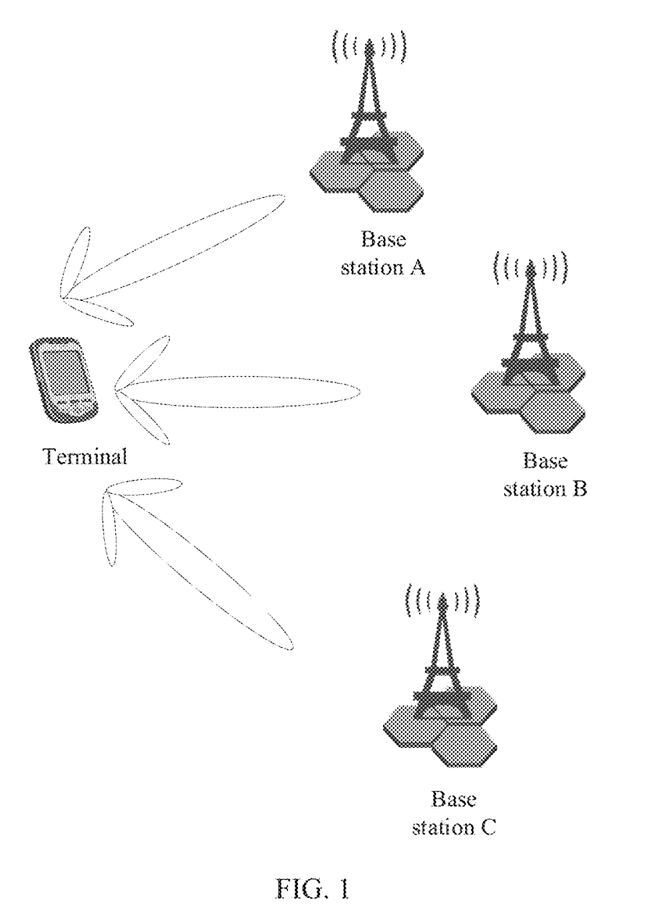
FIG. 1 is a schematic diagram of a structure of a wireless communication system according to an embodiment of this application.

FIG. 1 is a schematic diagram of a structure of a wireless communication system according to an embodiment of this application. As shown in FIG. 1, the wireless communication system includes a terminal, a base station A, a base station B, and a base station C.

In the wireless communication system, the wireless communication system may comply with a wireless communication standard in the 3rd Generation Partnership Project (3GPP), or may comply with another wireless communication standard, for example, a wireless communication standard in the 802 series (for example, 802.11, 802.15, or 802.20) of the Institute of Electrical and Electronics Engineers (IEEE).

Although FIG. 1 shows only three base stations and one terminal, the wireless communication system may alternatively include other quantities of terminals and base stations. In addition, the wireless communication system may further include another network device, for example, a core network device.

The terminal and the base station need to learn of configurations predefined by the wireless communication system, including a radio access technology (RAT) supported by the system and a configuration of a radio resource stipulated by the system, for example, basic configurations of a radio frequency band and a carrier. The carrier is a frequency range that complies with a stipulation of the system. The frequency range may be determined jointly based on a center frequency of the carrier (denoted as a carrier frequency) and bandwidth of the carrier. The configurations predefined by the system may be used as a part of a standard protocol for the wireless communication system, or may be determined through interaction between the terminal and the base station. Content of a related standard protocol may be prestored in memories of the terminal and the base station, or reflected as hardware circuits or software code of the terminal and the base station.

In the wireless communication system, the terminal and the base station each support one or more same RATs, for example, 5G NR or a RAT of a future evolved system. Specifically, the terminal and the base station each use a same air interface parameter, a same coding scheme, a same modulation scheme, and the like, and communicate with each other based on the radio resource stipulated by the system.

In FIG. 1, the terminal integrating a phased array may directionally point to the base station A, the base station B, and the base station C respectively by using different configurations. Compared with a conventional terminal, the terminal having a phased array function may implement more centralized energy transmission by using the phased array function, thereby reducing a path loss of signal transmission in a high frequency range, especially a millimeter-wave frequency range, to some extent.

In addition, to use spectrum resources more efficiently, a radio frequency range, especially the millimeter-wave frequency range, usually includes a plurality of different frequency bands, and the terminal integrating the phased array of a plurality of frequency bands can more fully utilize an advantage of radio frequency communication. For example, a 5G millimeter-wave frequency band defined in 3GPP includes n257 (26.5 GHz to 29.500 GHz), n260 (37 GHz to 40 GHz), n258 (24.25 GHz to 27.5 GHz), and n261 (27.5 GHz to 28.35 GHz). Correspondingly, in FIG. 2, n257 is identified as a first frequency band (Band 1), n260 is identified as a second frequency band (Band 2), n258 is identified as a third frequency band (Band 3), and n261 is identified as a fourth frequency band (Band 4). Band 1 and Band 2 are different and do not overlap. Center frequencies of Band 1 and Band 2 are respectively f1 (28 GHz) and f2 (38.5 GHz), and f2/f1=1.375, with a difference of 37.5%. Band 3 and Band 2 are also different and do not overlap. Center frequencies of Band 3 and Band 2 are respectively f1 (25.875 GHz) and f2 (38.5 GHz), and f2/f1=1.488, with a difference of about 50% between f2 and f1. Similarly, Band 4 and Band 2 are also different and do not overlap. Center frequencies of Band 4 and Band 2 are respectively f1

Figure 2:
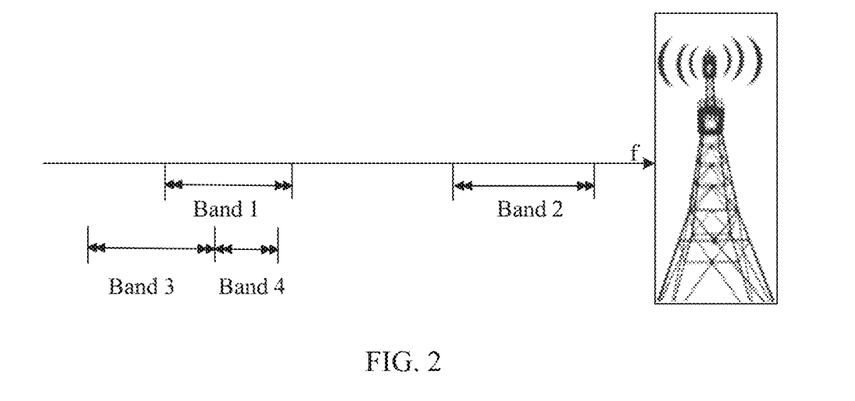
FIG. 2 is a schematic diagram of a plurality of frequency bands according to an embodiment of this application.

(27.925 GHz) and f2 (38.5 GHz), and f2/f1=1.379, with a difference of 38% between f2 and f1. Band 1 and Band 3 are different but overlap. Similarly, Band 1 and Band 4 are also different but overlap.

It should be noted that specific frequency ranges of Band 1 to Band 4 mentioned herein are merely examples, and may alternatively be other values in specific implementation. This is not specifically limited in this application. In addition, although only the foregoing several NR frequency bands are currently formulated in the 5G millimeter-wave band, it should be understood that the technical solutions provided in this application are also applicable to another frequency band in the millimeter-wave band and another radio frequency band.

Figure 3:
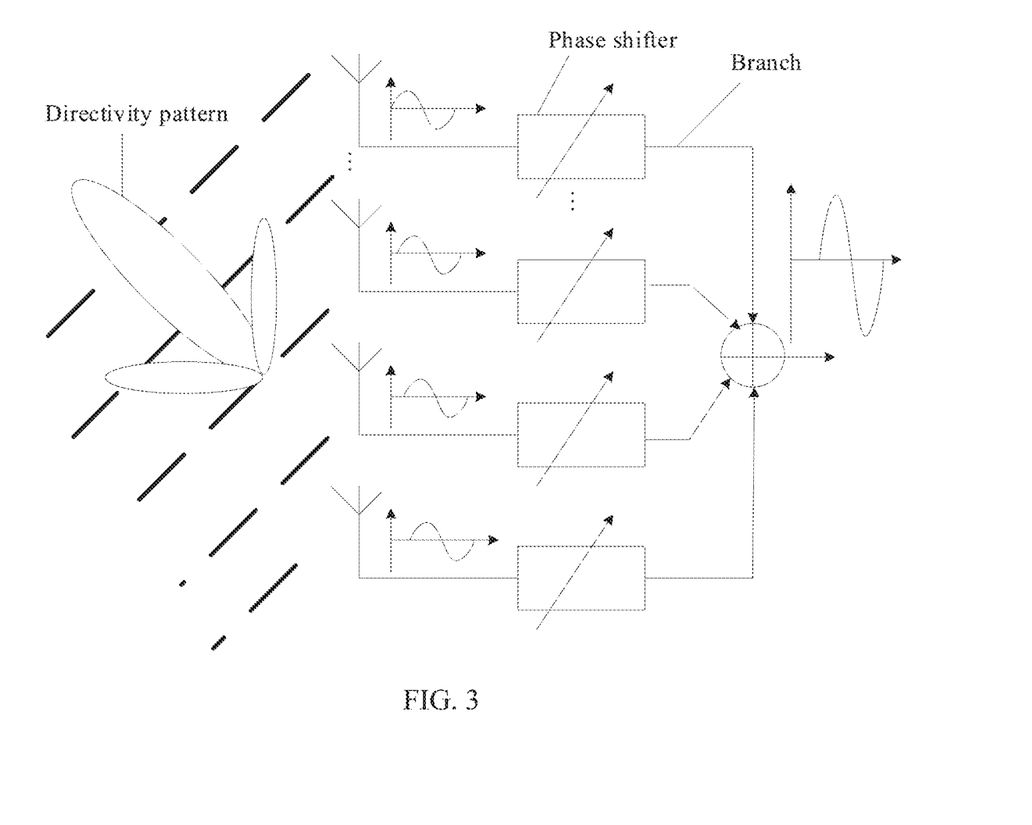
FIG. 3 is a schematic diagram of a phased array according to an embodiment of this application.

FIG. 3 is a schematic diagram of an architecture of a phased array according to an embodiment of this application. As shown in the figure, the phased array that may be applied to the foregoing embodiment may include a plurality of branches, and each branch includes a corresponding phase shifter. When the phased array needs to point to a specific direction to implement a beam in the specific direction, phase shifting may be performed on a signal of a corresponding branch by using a phase shifter in the phased array, to obtain a directivity pattern in the specific direction. When the phased array needs to dynamically cover a plurality of directions, the phased array may use a phase scanning manner to dynamically cover the plurality of directions. Because a phased array system needs a large scanning angle, there are specific requirements for phase shift precision and a phase shift range of the phase shifter of each branch. For ease of system control, optionally, the phased array may use a digital phase shifter technology. Each branch needs to adjust a phase of each branch by changing a digital control bit in a phase shift range implemented by using n bits, to implement phase scanning.

Figure 4:
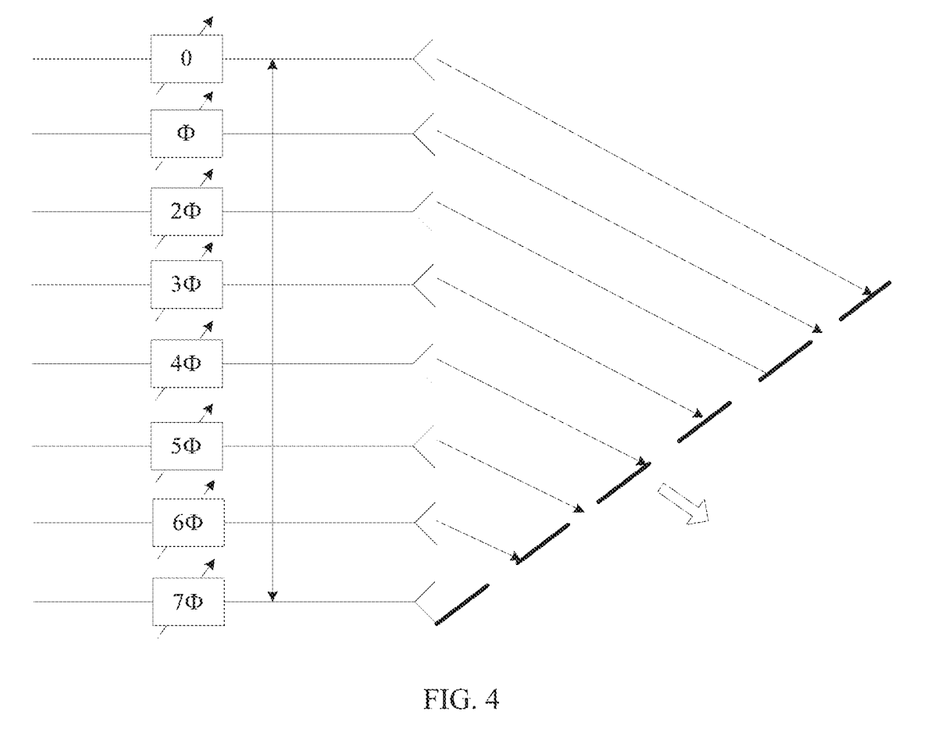
FIG. 4 is a schematic diagram of a working principle of a phased array according to an embodiment of this application.

Specifically, FIG. 4 is used as an example. An architecture of a phased array shown in FIG. 4 includes eight branches. To implement full coverage, each branch needs to implement a 3-bit digital phase shifter. That is, a phase range implemented by the eight branches is 0 to 7Φ, and the eight branches correspond to a phase shift range of digital control bits 000 to 111. Different bits have different phase shift precision. Using 3 bits as an example, phase shift precision corresponding to a least significant bit is $2^0\Phi=\Phi$, phase shift precision corresponding to a middle bit is $2^1\Phi=2\Phi$, and phase shift precision corresponding to a most significant bit is $2^2\Phi=4\Phi$. In this way, generally, a phase shift range of 360 degrees may be implemented by using 0 to 7Φ, and each phase shift unit Φ is 45 degrees. A minimum phase shift of each branch is 0Φ, that is, 0 degrees, and a control word of a bit of a corresponding phase shifter is 000. A maximum phase shift is 7Φ, that is, 315 degrees, and a control word of a bit of a corresponding phase shifter is 111. To achieve higher phase scanning precision, a bit may be further added. For example, the digital phase shifter may alternatively be a 4-bit digital phase shifter, and minimum phase shift precision Φ of each branch may be 22.5 degrees. After a working principle of the phased array is learned of, it may be understood that, to implement a function of receiving a signal, the phased array needs to integrate a corresponding receive link, for example, a low noise amplifier, into each branch in the foregoing embodiment. Similarly, based on the receiving function, to further implement a function of transmitting a signal, a corresponding transmit link, for example, a power amplifier, may be further integrated. Optionally, the receive link and the transmit link may reuse a same phase shifter, or an independent phase shifter may be separately disposed on each link. Phase shifters in a plurality of branches may generate different phases when being used for receiving or transmitting.

Figure 5:
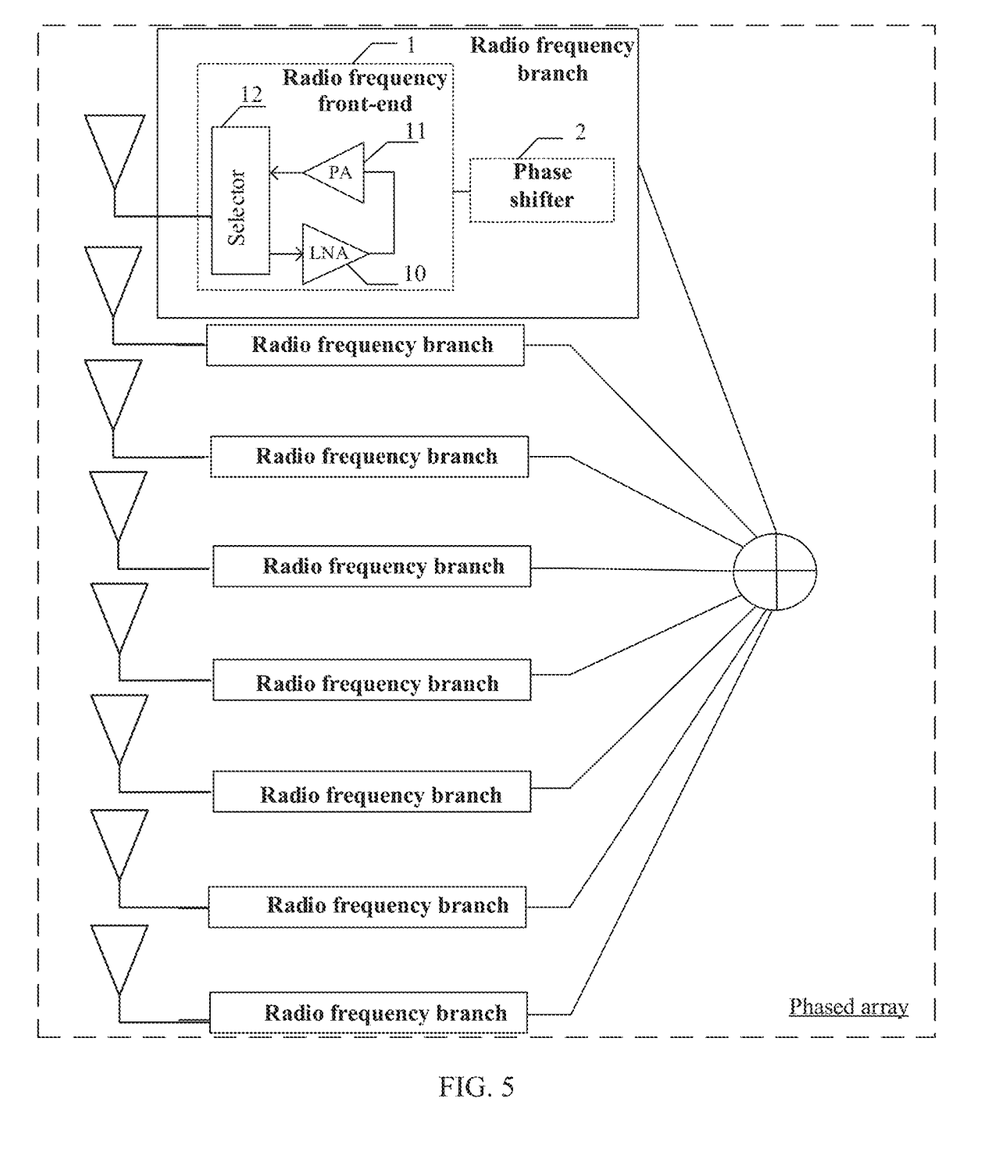
FIG. 5 is a schematic diagram of an architecture of a phased-array transceiver according to an embodiment of this application.

FIG. 5 is a schematic diagram of an architecture of a phased-array transceiver according to an embodiment of this application. A radio frequency phased array is used as an example. As shown in the figure, the phased array includes a plurality of radio frequency branches, and each of the plurality of radio frequency branches may include a corresponding radio frequency front-terminal 1 and a corresponding phase shifter 2. The radio frequency front-terminal 1 includes a low noise amplifier (LNA) 10 and a power amplifier (PA) 11. The low noise amplifier 10 is configured to amplify a received signal coupled from an antenna of a corresponding branch, and the power amplifier 11 is configured to perform power amplification on a transmitted signal and then output the transmitted signal to the antenna corresponding to the branch. Optionally, the phased array may alternatively be designed to have only one of receiving or transmitting functions, and correspondingly, each branch may alternatively include only one of the low noise amplifier 10 and the power amplifier 11.

Further, each branch may further include a selector 12, configured to implement transceiver duplex. When transmitting and receiving of the phased array are in different frequency bands, the selector may be a duplexer, configured to separate transmitted and received signals into different frequency bands. When transmitting and receiving are in different timeslots, the selector may be a switch, which selects and disables a same transmitted signal and a same received signal at different moments. Optionally, the selector 12 may be located at a front terminal of the branch, that is, coupled to an input terminal of the LNA and an output terminal of the PA, as shown in FIG. 4. Alternatively, the selector 12 may be located at a back terminal of the branch, that is, coupled to an output terminal of the LNA and an input terminal of the PA, and the PA and the LNA are directly coupled to the antenna.

Each of the plurality of radio frequency branches of the phased array further includes a phase shifter, configured to implement a phase shift function of each branch. For example, the phase shifter may be the phase shifter 2 shown in FIG. 5. The phase shifter 2 is coupled to a back-terminal common node of the PA 11 and the LNA 10, that is, the output terminal of the LNA and the input terminal of the PA. Optionally, the phase shifter 2 may alternatively be coupled to the input terminal of the LNA and the output terminal of the PA. The PA and the LNA may reuse the phase shifter 2, but this architecture in which a same phase shifter is reused for transmitting and receiving is applicable only to a time division duplex mode. When the PA and the LNA simultaneously work in different frequency bands, a separate phase shifter generally needs to be disposed on a transmit path and a receive path of each of the PA and the LNA.

When the phased array needs to integrate processing functions of two or more frequency bands, based on the foregoing embodiment, the following separately describes an LNA and a PA that implement a radio frequency front-terminal for signals of two or more frequency bands.

Figure 6:
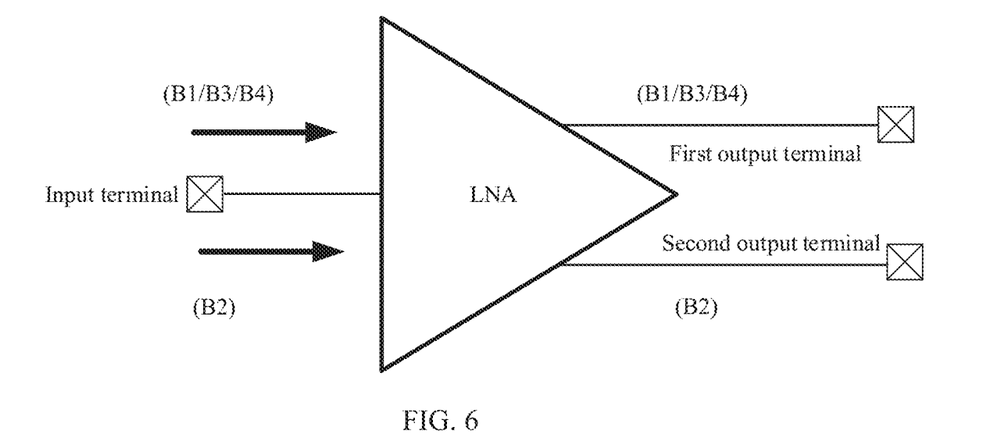
FIG. 6 is a schematic diagram of an architecture of an LNA used in a multi-band phased array according to an embodiment of this application.

As shown in FIG. 6, an LNA has one input terminal and two output terminals. The input terminal is configured to receive a signal of a first frequency band and a signal of a second frequency band, a first output terminal is configured to output the amplified signal of the first frequency band, and a second output terminal is configured to output the amplified signal of the second frequency band. Compared with an LNA architecture with one input terminal and one output terminal for wideband receiving, in an LNA design of this architecture, signals of different frequency bands may be flexibly received, to achieve a better signal-to-noise ratio and lower design costs.

Because two output terminals are used, if the two output terminals simultaneously perform output, a gain is reduced by 3 dB compared with an architecture with a single output terminal. Preferably, in a scenario in which a requirement on a system gain is high, one of the two output terminals may be selected. In a scenario in which a requirement on a system gain is not high, the two output terminals may be simultaneously selected.

In a specific receiving scenario, the LNA may simultaneously satisfy receiving of signals of more than two frequency bands. Specifically, signals of different frequency bands whose center frequencies are close may be output by using one output terminal of the LNA, and signals of different frequency bands whose center frequencies differ greatly may be output by using one of the first output terminal or the second output terminal.

The 5G millimeter-wave frequency band in FIG. 2 is used as an example. When the first frequency band and the second frequency band are different but overlap, for example, Band 3 and Band 1, and Band 4 and Band 1, the signal of the first frequency band and the signal of the second frequency band may be output by using only a same output terminal. When center frequencies of the first frequency band and the second frequency band are close, for example, with a difference less than 10%, for example, Band 3 and Band 1, the signal of the first frequency band and the signal of the second frequency band may also be output by using only a same output terminal. However, when the two frequency bands are different and do not overlap, and a difference between center frequencies of the frequency bands is greater than 30%, for example, a combination of Band 2 and each of Band 1, Band 3, and Band 4, the signal of the first frequency band and the signal of the second frequency band are respectively output by using the first output terminal and the second output terminal of the LNA.

For example, in a scenario in which a requirement on a gain is high, the LNA may support simultaneous receiving of signals of one or more frequency bands in a combination of B1, B3, and B4, but receive signals of the frequency band B2 and the frequency band combination in a time-sharing manner.

Figure 7:
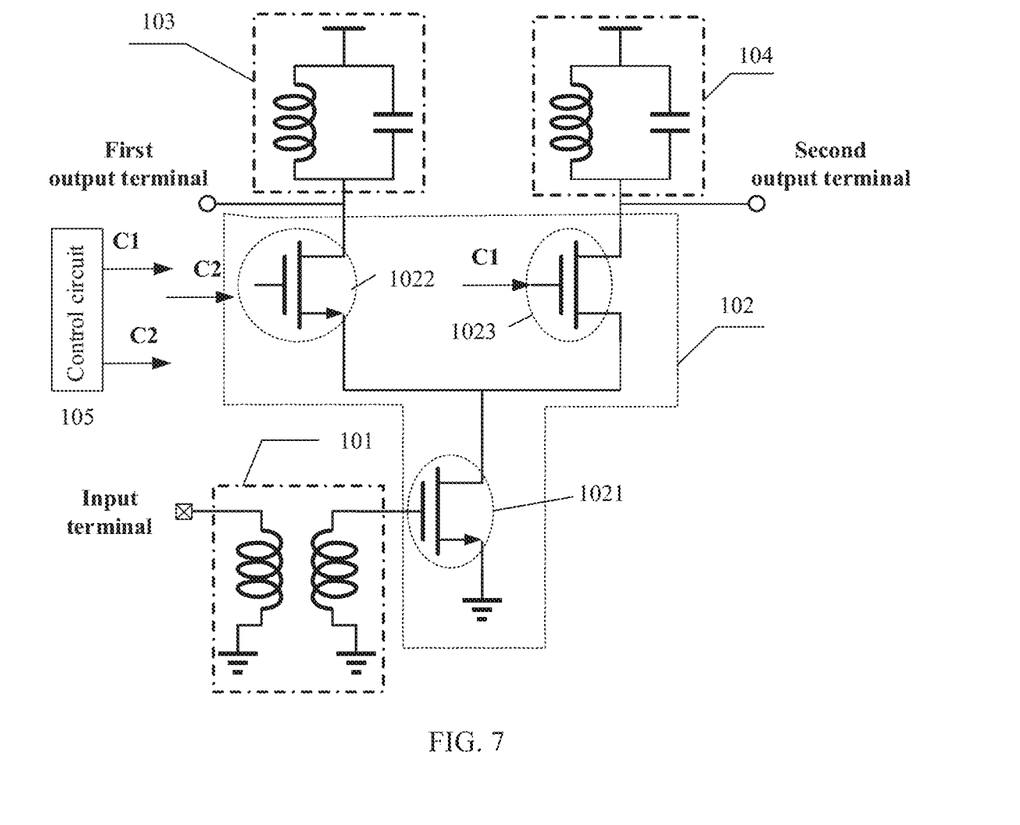
FIG. 7 is a schematic diagram of specific implementation of an LNA used in a multi-band phased array according to an embodiment of this application.

FIG. 7 is a schematic diagram of specific implementation of an LNA used in a multi-band phased array according to an embodiment of this application. The LNA includes an input matching network 101, a signal amplification circuit 102, a first output matching network 103, a second output matching network 104, and a control circuit 105. The input matching network 101 is coupled between an input terminal of the LNA and an input terminal of the signal amplification circuit 102. Two output terminals of the signal amplification circuit 102 are respectively coupled to a first output terminal and a second output terminal of the LNA. The first output terminal of the LNA is coupled to the first output matching network 103, and the second output terminal of the LNA is coupled to the second output matching network 104. The control circuit 105 is coupled to the signal amplification circuit 102 and is configured to control output selection of the signal amplification circuit 102.

Specifically, the input matching network 101 is coupled between the input terminal of the LNA and the amplification circuit and is configured to implement input matching of the LNA. Signals of different frequency bands received by the input terminal of the LNA are input into the input terminal of the amplification circuit by using the same input matching network. Therefore, preferably, the input matching network may include a transformer, that is, a first inductor coil and a second inductor coil that are coupled and nested with each other, which is configured to implement broadband matching. Further, the input matching network may further include an adjustable capacitor, configured to further implement a frequency adjustment function.

Optionally, the signal amplification circuit may further include two independent amplification sub-circuits, input terminals of the two amplification sub-circuits are both coupled to the input matching network 101, and output terminals of the two amplification sub-circuits are respectively coupled to the two output matching networks 103 and 104.

Preferably, the signal amplification circuit 102 may include a first amplification transistor 1021. An input terminal of the first amplification transistor 1021 is coupled to the input matching network 101, and an output terminal of the first amplification transistor 1021 is separately coupled to a second amplification transistor 1022 and a third amplification transistor 1023. Optionally, the first amplification transistor 1021, the second amplification transistor 1022, and the third amplification transistor 1023 may all be negative channel metal oxide semiconductor (NMOS) transistors. A gate electrode of 1021 is coupled to the input matching network 101, a source electrode of 1021 is grounded in a coupling manner, and a drain electrode of 1021 is coupled to source electrodes of 1022 and 1023.

Drain electrodes of 1022 and 1023 are coupled to a power supply terminal by respectively using the first output matching network 103 and the second output matching network 104, and gate electrodes of 1023 and 1022 are configured to receive a bias voltage. Optionally, the first amplification transistor 1021, the second amplification transistor 1022, and the third amplification transistor 1023 may alternatively be positive channel metal oxide semiconductor (PMOS) transistors. A connection method of the gate electrode is consistent with that of the NMOS type, and connection methods of the drain electrode and the source electrode may be correspondingly adjusted. Compared with two independent receiving sub-circuits, the signal amplification circuit 102 has more advantages in area, power consumption, and noise designs.

The control circuit 105 is coupled to the signal amplification circuit 102, and outputs a first enable signal C1 and a second enable signal C2, which are used to select a first output terminal and a second output terminal of the amplification circuit. Optionally, the control circuit 105 may not include a bias voltage module. The enable signals C1 and C2 may be digital enable signals, which are used to output corresponding digital control signals that represent enabling to a bias voltage module located in the amplification circuit. The bias voltage module outputs a corresponding power supply voltage and turn-off voltage based on the digital enable signals, to turn on and turn off the second amplification transistor 1022 and the third amplification transistor 1023, thereby implementing respective selection of the first output terminal and the second output terminal of the LNA.

Optionally, the control circuit 105 may alternatively include a bias voltage module. The control enable signals C1 and C2 may be analog enable signals, which directly output a corresponding power supply voltage and turn-off voltage to the signal amplification circuit 102, to turn on and turn off the second amplification transistor 1022 and the third amplification transistor 1023, thereby implementing respective selection of the first output terminal and the second output terminal of the LNA.

The first output matching network 103 and the second output matching network 104 are respectively used to match a first frequency band and a second frequency band. Preferably, in terms of matching network design, the matching networks do not need to be designed to be in a broadband mode. The two output matching networks are designed to respectively match the corresponding frequency bands. In terms of circuit design, the two output matching networks may use, but not limited to, inductor and capacitor networks that are connected in parallel. A capacitor may be designed as an adjustable capacitor and is configured to implement frequency adjustment in a specific range in a specific frequency band. When the first frequency band is lower than the second frequency band, a layout size of an inductor in 103 is designed to be greater than a size of an inductor in 104, to optimize a chip area and a corresponding quality factor.

Figure 8:
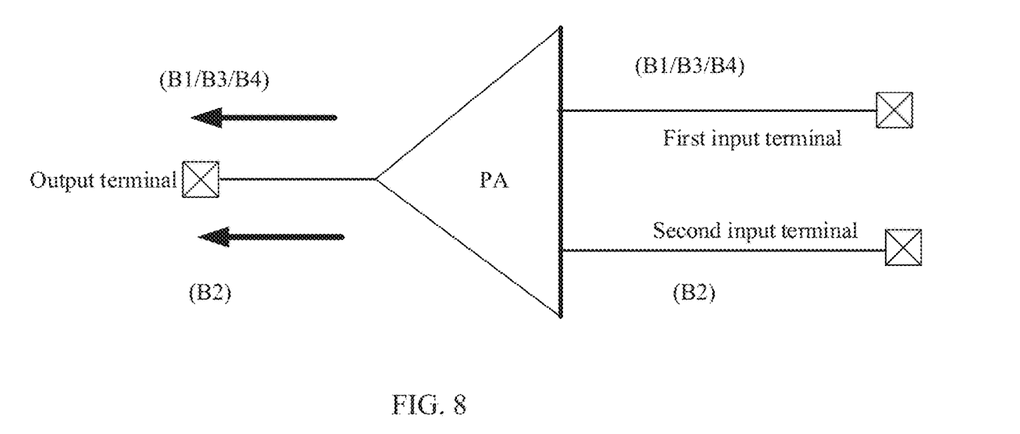
FIG. 8 is a schematic diagram of an architecture of a PA used in a multi-band phased array according to an embodiment of this application.

FIG. 8 shows an architecture of a multi-band PA. The PA includes two input terminals and one output terminal. A first input terminal is configured to input a to-be-amplified signal of a first frequency band, a second input terminal is configured to input a to-be-amplified signal of a second frequency band, and the output terminal is configured to output the amplified signal of the first frequency band and the amplified signal of the second frequency band. In the architecture of the PA shown in FIG. 8, output may be flexibly controlled based on characteristics of signals of different frequency bands. Compared with a PA architecture with one input terminal and one output terminal for wideband transmitting, in a PA design of this architecture, signals in different frequency bands may be flexibly transmitted purposefully, to achieve better transmit efficiency and lower design costs. Preferably, in a scenario in which a requirement on system transmit power is high, one of the two input terminals may be selected. In a scenario in which a requirement on system transmit power is not high, the two input terminals may be simultaneously selected. The architecture of the PA shown in FIG. 8 may further satisfy transmitting of signals of more than two frequency bands. Specifically, signals of different frequency bands whose center frequencies are close may be jointly input by using one input terminal of the PA, and signals of different frequency bands whose center frequencies differ greatly may be input by using one of the first input terminal or the second input terminal.

For example, the frequency bands in FIG. 2 are used as an example. In a scenario in which a requirement on transmit power is high, the PA may support simultaneous transmitting of signals of one or more frequency bands in a combination of B1, B3, and B4, but transmit signals of the frequency band B2 and the frequency band combination in a time-sharing manner.

Figure 9:
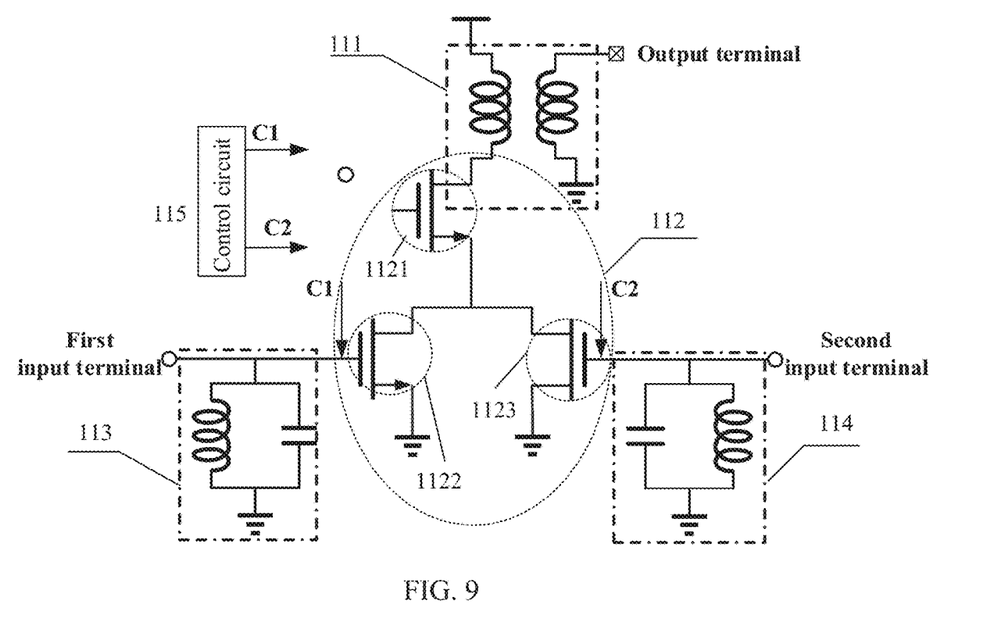
FIG. 9 is a schematic diagram of specific implementation of a PA used in a multi-band phased array according to an embodiment of this application.

FIG. 9 is a schematic diagram of specific implementation of a PA used in a multi-band phased array according to an embodiment of this application. The PA includes an output matching network 111, a power amplification circuit 112, a first input matching network 113, a second input matching network 114, and a control circuit 115. The output matching network 111 is coupled between an output terminal of the PA and an output terminal of the power amplification circuit 112. The power amplification circuit 112 includes two input terminals, which are respectively coupled to a first input terminal and a second input terminal of the PA. The first input terminal of the PA is coupled to the first input matching network 113, and the second input terminal of the PA is coupled to the second input matching network 114. The control circuit 115 is coupled to the power amplification circuit 112 and is configured to control input selection of the power amplification circuit 112.

Specifically, the output matching network 111 is coupled between the output terminal of the PA and the power amplification circuit 112 and is configured to implement output matching of the PA. Signals of different frequency bands output by the output terminal of the PA are output by using the same output matching network 111. Therefore, preferably, the output matching network 111 may include a transformer, that is, a first inductor coil and a second inductor coil that are coupled and nested with each other, which is configured to implement broadband matching. Further, the output matching network 111 may further include an adjustable capacitor, configured to further implement a frequency adjustment function.

The power amplification circuit 112 coupled to the output matching network 111 may include two independent amplification sub-circuits, output terminals of the two amplification sub-circuits are both coupled to the output matching network 111, and input terminals of the two amplification sub-circuits are respectively coupled to the first input terminal and the second input terminal of the PA.

Preferably, the power amplification circuit 112 may include a first amplification transistor 1121, a second amplification transistor 1122, and a third amplification transistor 1123. An output terminal of the first amplification transistor 1121 is coupled to the output matching network 111, and an input terminal of the first amplification transistor 1121 is separately coupled to the second amplification transistor 1122 and the third amplification transistor 1123. Optionally, the first amplification transistor 1121, the second amplification transistor 1122, and the third amplification transistor 1123 may all be NMOS transistors. A drain electrode of 1121 is coupled to the output matching network 111, a gate electrode of 1121 is configured to be coupled to a bias voltage, and a source electrode of 1121 is coupled to drain electrodes of 1122 and 1123. Source electrodes of 1122 and 1123 are grounded in a coupling manner, and gate electrodes of 1123 and 1122 are respectively configured to be coupled to the first input terminal and the second input terminal of the PA. Optionally, the first amplification transistor 1121, second amplification transistor 1122, and the third amplification transistor 1123 may alternatively be PMOS transistors. A connection method of the gate electrode is consistent with that of the NMOS type, and connection methods of the drain electrode and the source electrode may be correspondingly adjusted. Compared with two independent transmitting sub-circuits, an architecture of the power amplification circuit 112 has more advantages in an area and amplification efficiency.

The control circuit 115 is coupled to the power amplification circuit 112, and outputs a first enable signal C1 and a second enable signal C2, which are respectively used to select the second amplification transistor 1122 and the third amplification transistor 1123 of the amplification circuit. Optionally, the control circuit 115 may not include a bias voltage module. The control enable signals C1 and C2 may be digital enable signals, which are used to output corresponding digital control signals to a bias voltage module located in the amplification circuit. The bias voltage module outputs a corresponding power supply voltage and turn-off voltage based on the digital enable signals, to turn on and turn off the second amplification transistor 1122 and the third amplification transistor 1123, thereby implementing selection and turn-off of the first input terminal and the second input terminal of the PA.

Optionally, the control circuit 115 may alternatively include a bias voltage module. The control enable signals C1 and C2 may be analog enable signals, which directly output a corresponding power supply voltage and turn-off voltage to the power amplification circuit 112, to turn on and turn off the second amplification transistor 1122 and the third amplification transistor 1123, thereby implementing selection and turn-off of the first input terminal and the second input terminal of the PA.

The first input matching network 113 and the second input matching network 114 are respectively used to match the first input terminal and the second input terminal of the PA. Preferably, in terms of matching network design, the matching networks do not need to be designed to be in a broadband mode like the output matching network. The two input matching networks are designed to be in a narrowband matching mode, to respectively match corresponding frequency bands. In terms of circuit design, the two input matching networks may use, but not limited to, inductor and capacitor networks that are connected in parallel. A capacitor may be designed as an adjustable capacitor and is configured to implement frequency adjustment in a specific range in a specific frequency band. When a first frequency band is lower than a second frequency band, a layout size of an inductor in 113 is designed to be greater than a size of an inductor in 114, to optimize a chip area and a corresponding quality factor.

For a multi-band phased array, in addition to a design of a multi-band radio frequency front-terminal, a core is to implement a multi-band phase shift function. Considering the radio frequency front-terminal of the LNA and the PA for processing a plurality of frequency bands in the foregoing embodiments, in a preferred solution, different amplification sub-circuits are respectively used to process signals of different frequency bands whose center frequencies differ greatly, and a same amplification sub-circuit is used to process signals of different frequency bands whose center frequencies are close. In a design of a multi-band phase shifter, a similar idea may also be used.

Figure 10:
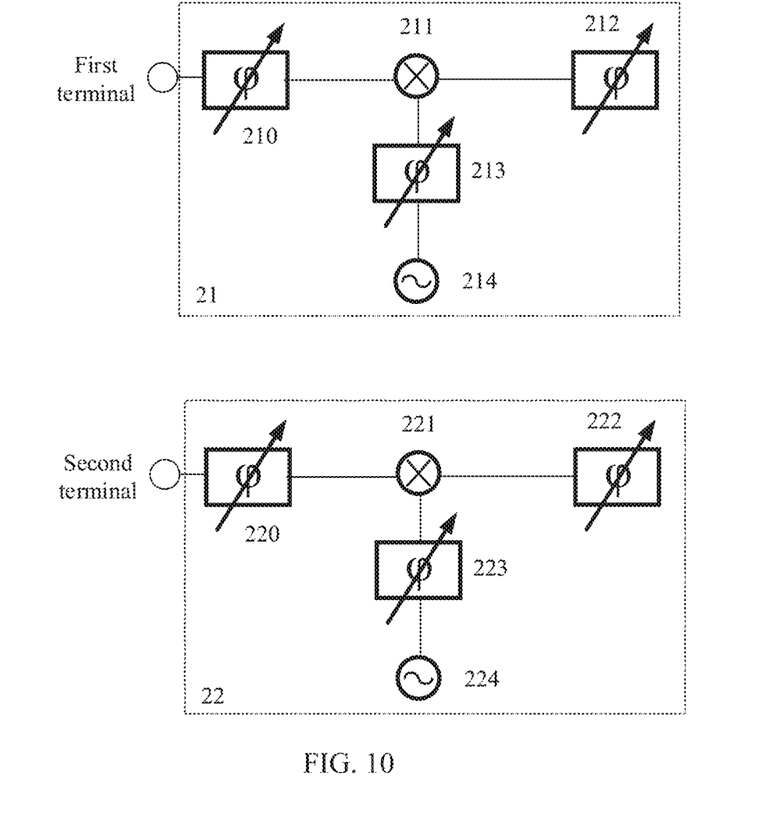
FIG. 10 is a schematic diagram of an architecture of a phase shifter used in a multi-band phased array according to an embodiment of this application.

FIG. 10 is a schematic diagram of an architecture of a phase shifter used in a multi-band phased array according to an embodiment of this application. FIG. 10 includes a first phase shift branch 21 coupled to a first terminal and a second phase shift branch 22 coupled to a second terminal. Specifically, the first phase shift branch 21 and the second phase shift branch 22 may be configured to perform phase shifting on signals of different frequency bands whose center frequencies differ greatly, and the first phase shift branch 21 or the second phase shift branch 22 may be separately used to perform phase shifting on signals of different frequency bands whose center frequencies are close.

For example, the frequency bands in FIG. 2 are used as an example. The first phase shift branch may be configured to perform phase shifting on signals of one or more frequency bands in a combination of B1, B3, and B4, and the second phase shift branch may be configured to perform phase shifting on a signal of the frequency band B2.

Specifically, the first phase shift branch may include one or more of phase shift units 210, 213, and 212. Similarly, the second phase shift branch may also include one or more of phase shift units 220, 223, and 222.

A first terminal of the first phase shift branch may be coupled to one or two of the first output terminal of the LNA and the first input terminal of the PA in the foregoing embodiments.

A second terminal of the first phase shift branch may be coupled to one or two of the second output terminal of the LNA and the second input terminal of the PA in the foregoing embodiments.

The phase shift unit 210 is coupled between a frequency mixer 211 and the first terminal of the phase shifter, the phase shift unit 220 is coupled between a frequency mixer 221 and the second terminal of the phase shifter, and the two phase shift units are respectively configured to perform phase shifting on radio frequency signals in the branches in which the two phase shift units are located. Such phase shifting is referred to as phase shifting of a radio frequency signal, and is currently a mainstream phase shift manner. The phase shift unit 213 is coupled between a local oscillator 214 and the frequency mixer 211, and the phase shift unit 223 is coupled between a local oscillator 224 and the frequency mixer 221. The phase shift unit 213 and the phase shift unit 223 respectively perform phase shifting on local oscillator signals that are before entering respective frequency mixers, to implement phase shifting on respective branches. Such phase shifting is referred to as phase shifting of a local oscillator signal. Compared with the previous phase shifting of a radio frequency signal, the phase shifting of a local oscillator signal is more suitable for signals of a wide frequency band or a plurality of frequency bands.

Optionally, the first phase shift branch 21 and the second phase shift branch 22 may reuse the same phase shift unit 213. Local oscillator signals generated by the local oscillator 214 and the local oscillator 224 select a time-sharing manner to pass through the same phase shift unit 213, and then enter respective frequency mixers.

Further, based on reuse of the same phase shift unit 213, the first phase shift branch 21 and the second phase shift branch 22 may further reuse a same local oscillator. The oscillator is designed as a wideband oscillator, which outputs local oscillator signals of different frequency bands in a time-sharing manner. The local oscillator signals enter respective frequency mixers in a time-sharing manner by using the same phase shift unit.

Optionally, the first phase shift branch 21 may further include the phase shifter 212, and the phase shifter 212 is coupled between the frequency mixer 211 and an intermediate frequency signal processor of the corresponding branch. The second phase shift branch 22 may further include the phase shifter 222, and the phase shifter 222 is coupled between the frequency mixer 221 and an intermediate frequency signal processor of the corresponding branch. The intermediate frequency signal processor includes but is not limited to a filter, an analog-to-digital converter, and a digital-to-analog converter. Such phase shifting is referred to as phase shifting of an intermediate frequency signal. Compared with the foregoing two phase shift manners, this phase shift architecture simplifies a design of combination and division of a plurality of radio frequency branches in the phased array. Specifically, in processing of a received signal, each radio frequency branch may perform intermediate frequency phase shifting on the received signal after frequency mixing, and then perform combination. In processing of a transmitted signal, the transmitted signal may be divided at an intermediate frequency before frequency mixing is performed on the transmitted signal, then intermediate frequency phase shifting is separately performed, and then the transmitted signal is provided for each radio frequency branch.

Preferably, the multi-band phase shifter may include a combination of phase shifting of an intermediate frequency signal and phase shifting of a local oscillator signal. Compared with separate phase shifting of a radio frequency signal and separate phase shifting of a local oscillator signal, this phase shifting combination manner simplifies a design of a phase shift circuit, and has a smaller circuit area and better performance.

Optionally, in different multi-band phase shift scenarios, the multi-band phase shifter may include various combinations of the foregoing plurality of phase shift units, to make full use of an advantage of an individual or a combination of the phase shift units.

Preferably, when phase shifting of a local oscillator signal is used, because each radio frequency branch in the phased array has a same working frequency, each radio frequency branch may use a same local oscillator signal generator. Then, phase shifting is performed on the local oscillator signal by a local oscillator signal phase shift unit of each branch, and then the local oscillator signal is provided for the frequency mixer of each branch.

Figure 11:
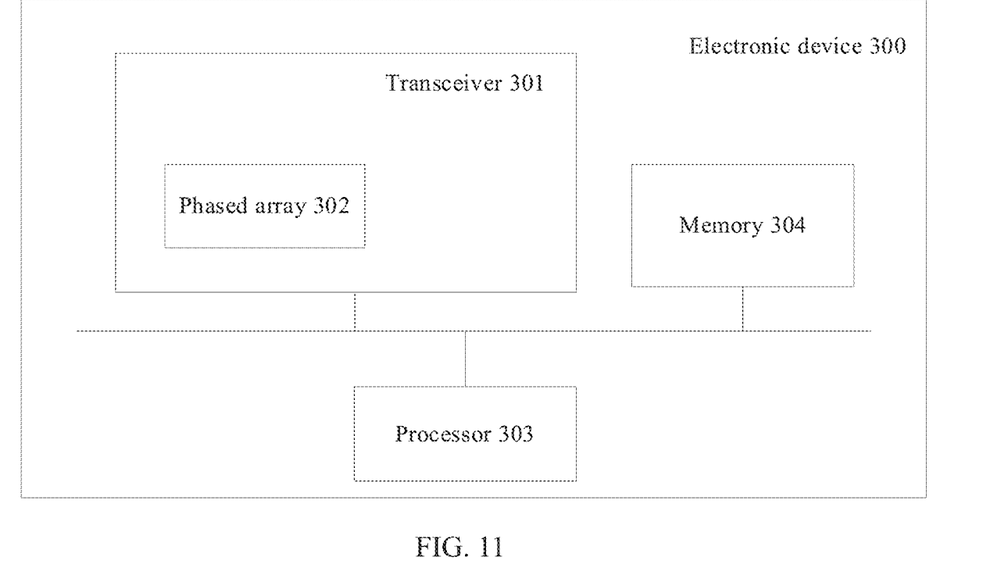
FIG. 11 is a schematic diagram of an electronic device according to an embodiment of this application.

An embodiment of this application further provides an electronic device 300. Referring to FIG. 11, the electronic device 300 may include a transceiver 301, a memory 304, and a processor 303. The foregoing phased array 302 is disposed in the transceiver 301 herein.

Figure 12:
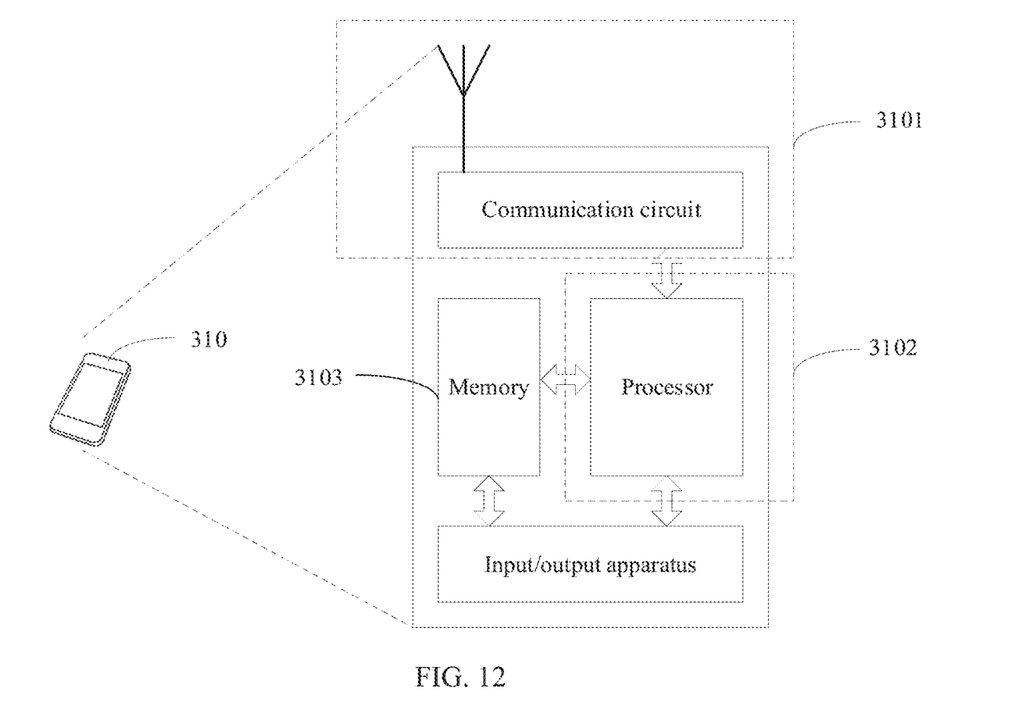
FIG. 12 is a schematic diagram of a smartphone according to an embodiment of this application.

It should be understood that the electronic device 300 herein may be specifically a terminal device such as a smartphone, a computer, or a smartwatch. A smartphone 310 shown in FIG. 12 is used as an example of the terminal device, and the smartphone 310 may specifically include a processor 3102, a memory 3103, a communication circuit, an antenna, and an input/output apparatus. The processor 3102 is mainly configured to process a communication protocol and communication data, control the entire smartphone, execute a software program, and process data of the software program, for example, configured to support the smartphone 310 in performing an action described in the foregoing embodiment. The memory 3103 is mainly configured to store a software program and data. The communication circuit is mainly configured to perform conversion between a baseband signal and a radio frequency signal and process the radio frequency signal. The communication circuit includes the foregoing phased array. The communication circuit is mainly configured to receive and transmit a radio frequency signal in a form of an electromagnetic wave. The input/output apparatus, such as a touchscreen, a display, or a keyboard, is mainly configured to: receive data input by a user and output data to the user.

After the smartphone 310 is powered on, the processor 3102 may read the software program in the memory 3103, interpret and execute instructions of the software program, and process data of the software program. When data needs to be sent wirelessly, the processor 3102 performs baseband processing on the to-be-sent data, and then outputs a baseband signal to a radio frequency circuit. The radio frequency circuit performs radio frequency processing on the baseband signal, and then sends, by using the antenna, a radio frequency signal in a form of an electromagnetic wave. When data is sent to the smartphone 310, the radio frequency circuit receives a radio frequency signal by using the antenna, converts the radio frequency signal into a baseband signal, and outputs the baseband signal to the processor 3102. The processor 3102 converts the baseband signal into data, and processes the data.

A person skilled in the art may understand that for ease of description, FIG. 12 shows only one memory and one processor. In an actual terminal device, there may be a plurality of processors and a plurality of memories. The memory may also be referred to as a storage medium, a storage device, or the like. It should be noted that a type of the memory is not limited in this embodiment of this application.

It should be understood that the $X^{th}$ frequency band mentioned in this application, for example, the first frequency band, the second frequency band, the third frequency band, and the fourth frequency band, is a fixed frequency range defined by a standardization organization or commercially used, and includes but is not limited to the 5G millimeter-wave frequency band defined in 3GPP in the embodiments of this application, including n257 (26.5 GHz to 29.500 GHz), n260 (37 GHz to 40 GHz), n258 (24.25 GHz to 27.5 GHz), and n261 (27.5 GHz to 28.35 GHz).

It should be understood that the signal of the $X^{th}$ frequency band mentioned in this application, for example, the signal of the first frequency band, the signal of the second frequency band, the signal of the third frequency band, and the signal of the fourth frequency band, is a signal transmitted in the $X^{th}$ frequency band. The signal may be a signal of full or partial bandwidth that is transmitted in the $X^{th}$ frequency band. For example, a corresponding signal of the frequency band n257 includes but is not limited to a signal 1 with a frequency range of 26.5 GHz to 27 GHz, a signal 2 with a frequency range of 27 GHz to 28 GHz, a signal 3 with a frequency range of 27 GHz to 29.5 GHz, and a signal 4 with a frequency range of 26.5 GHz to 29.5 GHz.

It should be understood that sequence numbers of the foregoing processes do not mean execution sequences in this application. The execution sequences of the processes should be determined based on functions and internal logic of the processes, and should not be construed as any limitation on the implementation processes of embodiments of this application. The term "coupling" mentioned in this application is used for indicating interworking or interaction between different components, and may include a direct connection or an indirect connection performed by using another component. For example, an XX terminal is grounded in a coupling manner, which indicates that the XX terminal may be directly grounded, or may be grounded by using another component.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A multi-band phased array, comprising:
a plurality of branches coupled to a plurality of multi-band antennas, wherein each of the plurality of branches comprises a low noise amplifier, the low noise amplifier is configured to amplify a signal of a first frequency band and a signal of a second frequency band that are received by the multi-band phased array, and the first frequency band and the second frequency band are different and do not overlap, and wherein:
the low noise amplifier comprises an input matching network, a signal amplification circuit, a first output matching network, and a second output matching network, wherein the input matching network is coupled to an input terminal of the signal amplification circuit and is configured to match the signal of the first frequency band and the signal of the second frequency band;

the first output matching network is coupled to a first output terminal of the signal amplification circuit, and the second output matching network is coupled to a second output terminal of the signal amplification circuit;

the low noise amplifier further comprises a control circuit, wherein the control circuit is configured to:
select the first output terminal to output the signal that is of the first frequency band and that is output by the signal amplification circuit, and
select the second output terminal to output the signal that is of the second frequency band and that is output by the signal amplification circuit; and each of the plurality of branches further comprises a phase shifter, wherein the phase shifter is configured to:
perform phase shifting on the signal that is of the first frequency band and that is output by the first output terminal, and
perform phase shifting on the signal that is of the second frequency band and that is output by the second output terminal.

2. The multi-band phased array according to claim 1, wherein
a difference between a center frequency of the first frequency band and a center frequency of the second frequency band is greater than 30%.

3. The multi-band phased array according to claim 2, wherein
the multi-band phased array is configured to receive the signal of the first frequency band and the signal of the second frequency band in a time-sharing manner.

4. The multi-band phased array according to claim 1, wherein
the multi-band phased array is further configured to receive a signal of a third frequency band, and the third frequency band and the first frequency band are different but overlap.

5. The multi-band phased array according to claim 4, wherein
the control circuit is configured to select the first output terminal to output the signal that is of the third frequency band and that is amplified by the signal amplification circuit.

6. The multi-band phased array according to claim 4, wherein
the multi-band phased array is configured to simultaneously receive the signal of the first frequency band and the signal of the third frequency band.

7. The multi-band phased array according to claim 1, wherein
the signal amplification circuit comprises a first negative channel metal oxide semiconductor (NMOS) transistor, a second NMOS transistor, and a third NMOS transistor, wherein a gate terminal of the first NMOS transistor is coupled to the input matching network, a source terminal of the first NMOS transistor is grounded in a coupling manner, and a source terminal of the second NMOS transistor and a source terminal of the third NMOS transistor are jointly coupled to a drain terminal of the first NMOS transistor;

the control circuit is configured to output a first enable signal and a second enable signal, the first enable signal is used to select the signal of the first frequency band by controlling a gate terminal of the second NMOS transistor, and the second enable signal is used to select the signal of the second frequency band by controlling a gate terminal of the third NMOS transistor; and a drain terminal of the second NMOS transistor is coupled to the first output matching network, and a drain terminal of the third NMOS transistor is coupled to the second output matching network.

8. The multi-band phased array according to claim 1, wherein the phase shifter comprises a first phase shift branch and a second phase shift branch, and wherein:
the first phase shift branch is coupled to the first output terminal, and the first phase shift branch is configured to perform phase shifting on the signal that is of the first frequency band and that is output by the first output terminal, and
the second phase shift branch is coupled to the second output terminal, and the second phase shift branch is configured to perform phase shifting on the signal that is of the second frequency band and that is output by the second output terminal.

9. The multi-band phased array according to claim 8, wherein
the first phase shift branch comprises a first frequency mixer and a first phase shift unit, and the second phase shift branch comprises a second frequency mixer and a second phase shift unit; and
the first phase shift unit is coupled between the first frequency mixer and a local oscillator signal generator, and the second phase shift unit is coupled between the second frequency mixer and the local oscillator signal generator.

10. The multi-band phased array according to claim 9, wherein
the local oscillator signal generator comprises a first local oscillator and a second local oscillator; and
the first phase shift unit is coupled between the first local oscillator and the first frequency mixer, and the second phase shift unit is coupled between the second local oscillator and the second frequency mixer.

11. The multi-band phased array according to claim 9, wherein
the first phase shift branch further comprises a third phase shifter, wherein the third phase shifter is coupled between the first frequency mixer and an intermediate frequency signal processor, and the third phase shifter is configured to perform phase shifting on an intermediate frequency signal of the first phase shift branch; and
the second phase shift branch further comprises a fourth phase shifter, wherein the fourth phase shifter is coupled between the second frequency mixer and the intermediate frequency signal processor, and the fourth phase shifter is configured to perform phase shifting on an intermediate frequency signal of the second phase shift branch.

12. The multi-band phased array according to claim 1, wherein
each of the plurality of branches further comprises a power amplifier, wherein the power amplifier comprises a first input matching network, a second input matching network, a power amplification circuit, and an output matching network, and wherein the first input matching network is coupled to a first input terminal of the power amplification circuit, the second input matching network is coupled to a second input terminal of the power amplification circuit, and the output matching network is coupled to an output terminal of the power amplification circuit; and the power amplifier further comprises a control circuit, wherein the control circuit is configured to:
  select the first input terminal to input a signal that is of the first frequency band and that is to be amplified by the power amplification circuit, and
  select the second input terminal to input a signal that is of the second frequency band and that is to be amplified by the power amplification circuit.

13. The multi-band phased array according to claim 12, wherein
  the power amplification circuit comprises a third NMOS transistor, a fourth NMOS transistor, and a fifth NMOS transistor, wherein a drain terminal of the third NMOS transistor is coupled to a power supply end by using the output matching network, a gate terminal of the third NMOS transistor is configured to receive a bias voltage, and a drain terminal of the fourth NMOS transistor and a drain terminal of the fifth NMOS transistor are jointly coupled to a source terminal of the third NMOS transistor;
  the control circuit is configured to output a first enable signal and a second enable signal, the first enable signal is used to select a to-be-amplified signal of the first frequency band by controlling a gate terminal of the fourth NMOS transistor, and the second enable signal is used to select a to-be-amplified signal of the second frequency band by controlling a gate terminal of the fifth NMOS transistor;
  the gate terminal of the fourth NMOS transistor is coupled to the first input matching network, and a source terminal of the fourth NMOS transistor is grounded in a coupling manner; and
  the gate terminal of the fifth NMOS transistor is coupled to the second input matching network, and a source terminal of the fifth NMOS transistor is grounded in a coupling manner.

14. The multi-band phased array according to claim 12, wherein
  a first input terminal of the power amplifier is coupled to a first output terminal of the low noise amplifier, and a second input terminal of the power amplifier is coupled to a second output terminal of the low noise amplifier.

15. An electronic device, comprising a transceiver, one or more memories, and at least one processor, wherein the transceiver comprises a multi-band phased array comprising:
  a plurality of branches coupled to a plurality of multi-band antennas, wherein each of the plurality of branches comprises a low noise amplifier, the low noise amplifier is configured to amplify a signal of a first frequency band and a signal of a second frequency band that are received by the multi-band phased array, and the first frequency band and the second frequency band are different and do not overlap;
  the low noise amplifier comprises an input matching network, a signal amplification circuit, a first output matching network, and a second output matching network, wherein the input matching network is coupled to an input terminal of the signal amplification circuit, and the input matching network is configured to match the signal of the first frequency band and the signal of the second frequency band;
  the first output matching network is coupled to a first output terminal of the signal amplification circuit, and the second output matching network is coupled to a second output terminal of the signal amplification circuit;
  the low noise amplifier further comprises a control circuit, wherein the control circuit is configured to:
    select the first output terminal to output the signal that is of the first frequency band and that is output by the signal amplification circuit, and
    select the second output terminal to output the signal that is of the second frequency band and that is output by the signal amplification circuit; and
  each of the plurality of branches further comprises a phase shifter, wherein the phase shifter is configured to:
    perform phase shifting on the signal that is of the first frequency band and that is output by the first output terminal, and
    perform phase shifting on the signal that is of the second frequency band and that is output by the second output terminal.

16. The electronic device according to claim 15, wherein a difference between a center frequency of the first frequency band and a center frequency of the second frequency band is greater than 30%.

17. The electronic device according to claim 16, wherein the multi-band phased array is configured to receive the signal of the first frequency band and the signal of the second frequency band in a time-sharing manner.

18. The electronic device according to claim 15, wherein the multi-band phased array is further configured to receive a signal of a third frequency band, and the third frequency band and the first frequency band are different but overlap.

19. The electronic device according to claim 18, wherein the control circuit is configured to select the first output terminal to output the signal that is of the third frequency band and that is amplified by the signal amplification circuit.

20. The electronic device according to claim 18, wherein the multi-band phased array is configured to simultaneously receive the signal of the first frequency band and the signal of the third frequency band.

* * * * *